(12) United States Patent
Kong et al.

(10) Patent No.: US 12,213,391 B2
(45) Date of Patent: *Jan. 28, 2025

(54) RESISTIVE RANDOM ACCESS MEMORY AND METHOD OF FORMING THE SAME

(71) Applicant: United Semiconductor (Xiamen) Co., Ltd., Fujian (CN)

(72) Inventors: Dejin Kong, Fujian (CN); Jinjian Ouyang, Fujian (CN); Xiang Bo Kong, Fujian (CN); Wen Yi Tan, Fujian (CN)

(73) Assignee: United Semiconductor (Xiamen) Co., Ltd., Fujian (CN)

( * ) Notice: Subject to any disclaimer, the term of this patent is extended or adjusted under 35 U.S.C. 154(b) by 18 days.

This patent is subject to a terminal disclaimer.

(21) Appl. No.: 18/218,570

(22) Filed: Jul. 5, 2023

(65) Prior Publication Data
US 2023/0345848 A1 Oct. 26, 2023

Related U.S. Application Data

(63) Continuation of application No. 17/326,353, filed on May 21, 2021, now Pat. No. 11,737,381.

(30) Foreign Application Priority Data

Apr. 16, 2021 (CN) .......................... 202110411977.2

(51) Int. Cl.
*H10B 63/00* (2023.01)
*H10N 70/00* (2023.01)

(52) U.S. Cl.
CPC .......... *H10N 70/841* (2023.02); *H10B 63/80* (2023.02); *H10N 70/021* (2023.02); *H10N 70/066* (2023.02); *H10N 70/068* (2023.02); *H10N 70/8833* (2023.02)

(58) Field of Classification Search
CPC .. H10N 70/841; H10N 70/021; H10N 70/066; H10N 70/068; H10N 70/8833; H10N 70/20; H10N 70/011; H10B 63/80
USPC .................................................. 365/148, 158
See application file for complete search history.

(56) References Cited

U.S. PATENT DOCUMENTS

| | | |
|---|---|---|
| 9,553,265 B1 | 1/2017 | Yang |
| 10,062,943 B2 | 8/2018 | Li |
| 10,109,474 B1 | 10/2018 | Wang |
| 10,153,342 B1 | 12/2018 | He |
| 10,262,986 B2 | 4/2019 | Dai |
| 10,396,145 B2 | 8/2019 | Balakrishnan |
| 10,460,980 B2 | 10/2019 | Verma |
| 11,088,323 B2 * | 8/2021 | Chou ............... H10N 70/826 |
| 12,096,704 B2 * | 9/2024 | Zhou ............... H10N 70/063 |

(Continued)

FOREIGN PATENT DOCUMENTS

KR 10-2011-0073648 A 6/2011

*Primary Examiner* — Michael T Tran
(74) *Attorney, Agent, or Firm* — Winston Hsu

(57) ABSTRACT

A resistive random access memory includes a first dielectric layer, a bottom electrode on the first dielectric layer, a variable-resistance layer on the bottom electrode and having a U-shaped cross-sectional profile, a top electrode on the variable-resistance layer and filling a recess in the variable-resistance layer, a second dielectric layer on the first dielectric layer and around the variable-resistance layer and the bottom electrode, and a spacer on the bottom electrode and inserting between the variable-resistance layer and the second dielectric layer.

10 Claims, 7 Drawing Sheets

(56) References Cited

U.S. PATENT DOCUMENTS

| | | |
|---|---|---|
| 2009/0174519 A1 | 7/2009 | Mikawa |
| 2010/0176365 A1 | 7/2010 | Park |
| 2011/0155989 A1 | 6/2011 | Park |
| 2012/0063201 A1 | 3/2012 | Hayakawa |
| 2012/0256152 A1 | 10/2012 | Kakegawa |
| 2013/0075686 A1 | 3/2013 | Kawasaki |
| 2014/0110659 A1 | 4/2014 | Murase |
| 2014/0113430 A1 | 4/2014 | Hayakawa |
| 2016/0079524 A1 | 3/2016 | Do |
| 2016/0268505 A1 | 9/2016 | Sung |
| 2016/0276586 A1 | 9/2016 | Trinh |
| 2019/0123270 A1 | 4/2019 | Mo |
| 2020/0075857 A1* | 3/2020 | Chou .................. H10B 63/30 |
| 2020/0335353 A1* | 10/2020 | Chen .................. H01L 23/528 |
| 2021/0013403 A1 | 1/2021 | Wang |
| 2021/0408373 A1 | 12/2021 | Chen |
| 2022/0059762 A1 | 2/2022 | Yang |
| 2022/0093857 A1 | 3/2022 | Sung |
| 2022/0093858 A1 | 3/2022 | Hsu |
| 2022/0359610 A1* | 11/2022 | Min .................. H10N 50/01 |
| 2023/0165173 A1* | 5/2023 | Shin .................. H10N 70/882 257/4 |
| 2023/0413698 A1* | 12/2023 | Wang .................. H10N 70/826 |
| 2024/0074148 A1* | 2/2024 | Lee .................. H10B 12/50 |
| 2024/0090351 A1* | 3/2024 | Vellianitis .......... H10N 70/011 |

\* cited by examiner

RESISTIVE RANDOM ACCESS MEMORY AND METHOD OF FORMING THE SAME

CROSS REFERENCE TO RELATED APPLICATIONS

This application is a continuation application of U.S. application Ser. No. 17/326,353, filed on May 21, 2021. The content of the application is incorporated herein by reference.

BACKGROUND OF THE INVENTION

1. Field of the Invention

The present invention generally relates to a semiconductor device and method for forming the same. More particularly, the present invention relates to a resistive random access memory (RRAM) and method for forming the same.

2. Description of the Prior Art

Resistive random-access memory (RRAM) is a type of non-volatile memory (NVM), and has the advantages such as smaller feature size, fast processing speed, longer data retention, lower power consumption, and better reliability, and may be formed conventionally integrated with conventional semiconductor process, and therefore has drawn high interest in the field. The basic structure of a RRAM cell includes a top electrode overlapping on a bottom electrode wherein the top electrode and the bottom electrode are separated from each other by a variable-resistance layer sandwiched therebetween. The variable-resistance layer may undergo a phase change between a high resistance state (HRS) and a low resistance state (LRS) when being properly biased. The different resistance states are compiled into either "1" or "0" representatively to store data.

Conventionally, embedded resistive RRAMs are usually formed in an interlayer dielectric layer of the interconnecting structure of the semiconductor device through the BEOL process. However, as the distances between the memory cells are gradually shrunk for a higher array density and memory capacity, the gap fill capability of the dielectric layer filling between the memory cells has been challenged. When the distances between the memory cells are smaller beyond the gap fill capability of the dielectric layer, a void may be formed between the memory cells and adversely affect the product yield.

SUMMARY OF THE INVENTION

One objective of the present invention is to provide a resistive random access memory (RRAM) and method for forming the same. The RRAM of the present invention is formed by forming openings in a dielectric layer and subsequently forming the memory cells in the openings. In this way, there is no need for the present invention to form a dielectric layer to fill the gaps between the memory cells, so that voids caused by insufficient gap fill capability of the dielectric layer may be prevented.

According to one embodiment of the present invention, a resistive random access memory is provided. The resistive random access memory includes a first dielectric layer, a bottom electrode on the first dielectric layer, a variable-resistance layer on the bottom electrode and having a U-shaped cross-sectional profile, a top electrode on the variable-resistance layer and filling a recess in the variable-resistance layer, a second dielectric layer on the first dielectric layer and around the variable-resistance layer and the bottom electrode, and a spacer on the bottom electrode and inserting between the variable-resistance layer and the second dielectric layer.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are schematic drawings and included to provide a further understanding of the embodiments, and are incorporated in and constitute a part of this specification. The drawings illustrate some of the embodiments and, together with the description, serve to explain their principles. Relative dimensions and proportions of parts of the drawings have been shown exaggerated or reduced in size and are not necessarily drawn to scale, for the sake of clarity and convenience in the drawings. The same reference signs are generally used to refer to corresponding or similar features in modified and different embodiments.

DETAILED DESCRIPTION

To provide a better understanding of the present invention to those of ordinary skill in the art, several exemplary embodiments of the present invention will be detailed as follows, with reference to the accompanying drawings using numbered elements to elaborate the contents and effects to be achieved. The accompanying drawings are included to provide a further understanding of the embodiments, and are incorporated in and constitute a part of this specification. These embodiments are described in sufficient detail to enable those skilled in the art to practice the invention. Other embodiments may be utilized and that structural, logical and electrical changes may be made without departing from the spirit and scope of the present invention.

FIG. 1 to FIG. 7 are schematic cross-sectional views illustrating the steps of a manufacturing process for forming a resistive random access memory (RRAM) according to an embodiment of the present invention. Please refer to FIG. 1. A substrate 10 is provided 10. Subsequently, a first dielectric layer 16 is formed on the substrate 10, and a bottom electrode 20 is formed on the first dielectric layer 16.

Figure 1:
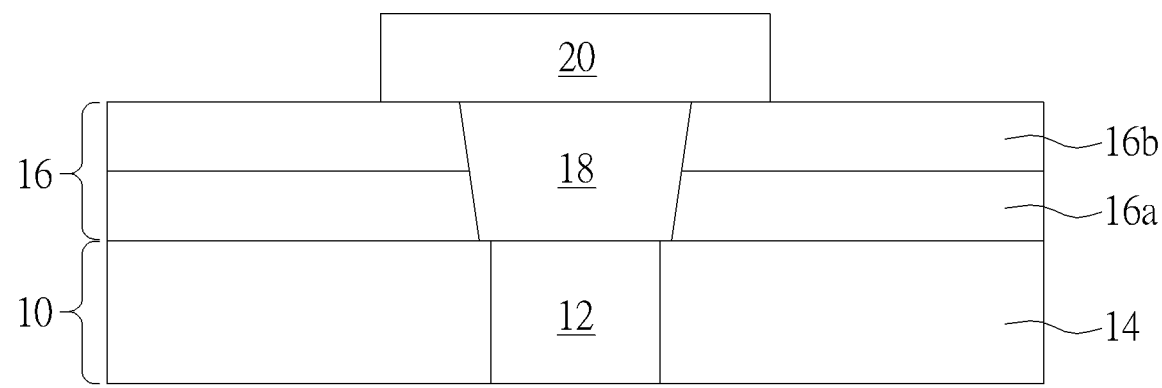
FIG. 1 to FIG. 7 are schematic cross-sectional views illustrating the steps of a manufacturing process for forming a resistive random access memory (RRAM) according to an embodiment of the present invention.

According to an embodiment of the present invention, the resistive random access memory may be formed in a dielectric layer of an interconnecting structure on the substrate 10. The substrate 10 may have finished the front-end-online (FEOL) processes and may include, for example, isolations structures, transistors and contacts formed therein. The substrate 10 may also have finished a portion of the back-end-online (BEOL) process and may include dielectric layers and conductive structures formed therein. For the sake of simplicity, only a dielectric layer 14 and a conductive structure 12 formed in the dielectric layer 14 are shown in FIG. 1. According to an embodiment of the present invention, the first dielectric layer 16 may include an etching stop layer 16a and a pad layer 16b disposed on the etching stop layer 16a. A conductive via 18 may be formed in the first dielectric layer 16 and penetrates through the pad layer 16b and the etching stop layer 16a to be electrically connected to the conductive structure 12.

The dielectric layer 14 and the pad layer 16b may include dielectric materials such as silicon oxide ($SiO_2$), undoped silica glass (USG), or low-k dielectric materials such as fluorinated silica glass (FSG), hydrogenated silicon oxycarbide (SiCOH), spin-on glass, porous low-k dielectric materials, or organic polymer dielectric materials, but are not limited thereto. According to an embodiment of the present invention, the dielectric layer 14 includes a low-k dielectric material, and the pad layer 16b includes silicon oxide. The etching stop layer 16a may include a nitrogen-containing dielectric material, such as silicon nitride (SiN), silicon oxynitride (SiON), silicon carbon nitride (SiCN), or nitride doped silicon carbide (NDC), but is not limited thereto. According to an embodiment of the present invention, the etching stop layer 16a may include nitride doped silicon carbide. The bottom electrode 20, the conductive structure 12, and the conductive via 18 may include metals, such as cobalt (Co), copper (Cu), aluminum (Al), tungsten (W), nickel (Ni), platinum (Pt), tantalum (Ta), titanium (Ti), compounds of the above materials, composite layers of the above materials, or alloys of the above materials, but are not limited thereto. According to an embodiment of the present invention, the bottom electrode 20 may include titanium nitride (TiN), the conductive structure 12 may include copper (Cu), and the conductive via 18 may include tungsten (W). According to an embodiment of the present invention, a barrier layer (not shown) may be disposed between the conductive via 18 and the first dielectric layer 16 and the conductive structure 12. The barrier layer may include a single layer or multiple layers formed by, for example, titanium, titanium nitride, tantalum, and/or tantalum nitride.

Figure 2:
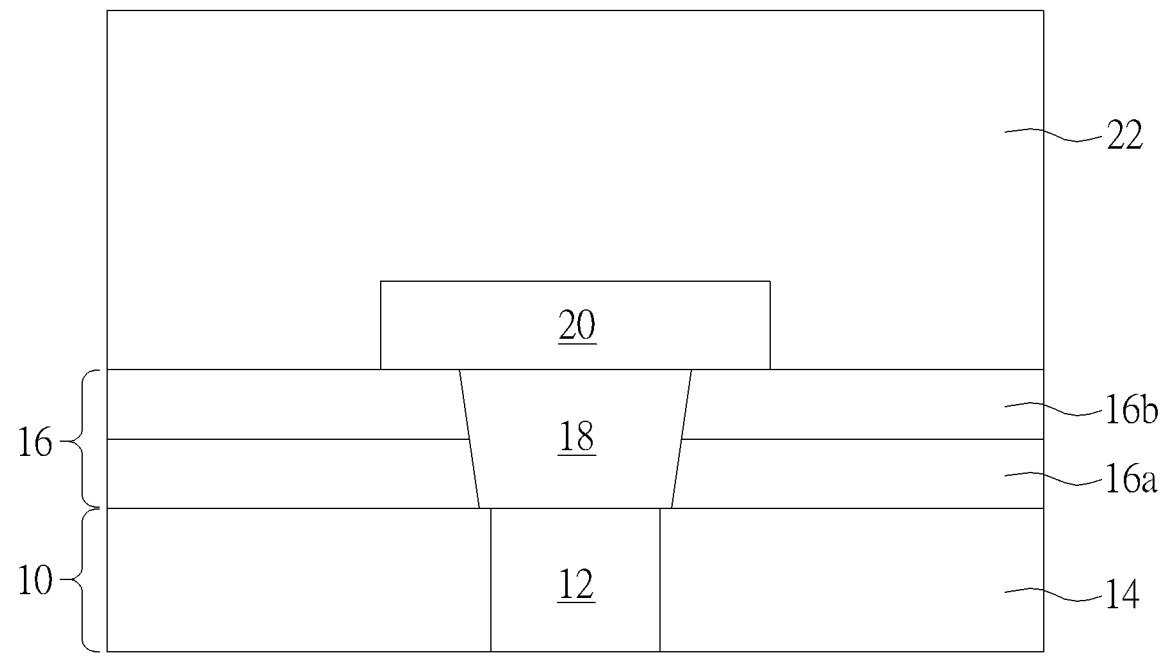

Please refer to FIG. 2. Following, a second dielectric layer 22 is formed on the first dielectric layer 16 and covers the bottom electrode 20. The material of the second dielectric layer 22 may be selected from the dielectric materials for the dielectric layer 14 and the pad layer 16b previously illustrated, and will not be repeated here for the sake of simplicity. According to an embodiment of the present invention, the second dielectric layer 22 may include a low-k dielectric material.

Figure 3:
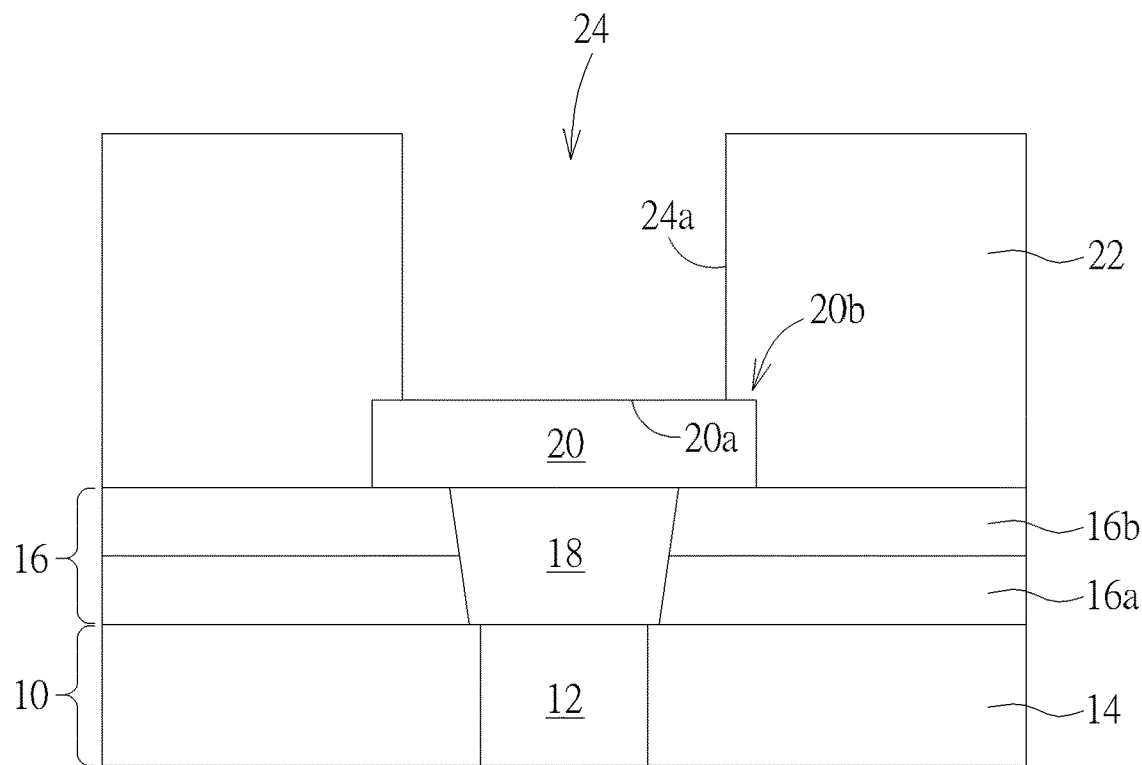

Please refer to FIG. 3. Subsequently, a patterning process (such as a photolithography-etching process) may be carried out to form an opening 24 in the second dielectric layer 22 directly above the bottom electrode 20. A portion of the top surface 20a of the bottom electrode 20 is exposed from the opening 24. The width of the opening 24 may be approximately equal to or smaller than the width of the bottom electrode 20. In the embodiment shown in FIG. 3, the width of the opening 24 is smaller than the width of the bottom electrode 20, and a sidewall 24a of the opening 24 may be disposed on the top surface 20a of the bottom electrode 20 and is not aligned with the sidewall of the bottom electrode 20. The top corner 20b of the bottom electrode 20 may be encompassed by the second dielectric layer 22 and not exposed.

Figure 4:
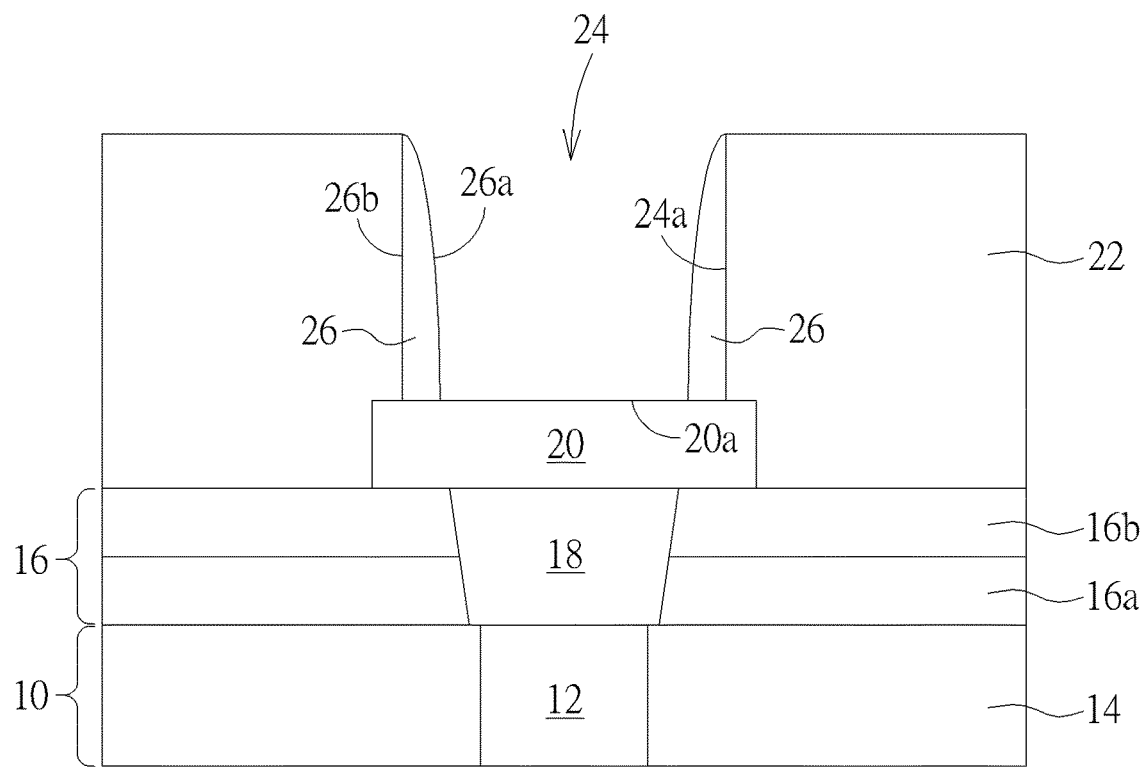

Please refer to FIG. 4. Subsequently, a spacer 26 is formed on the sidewall 24a of the opening 24. According to an embodiment of the present invention, the spacer 26 may be formed by a self-aligned spacer process. For example, an atomic layer deposition (ALD) process may be performed to form a spacer material layer (not shown) conformally covering the top surface of the second dielectric layer 22, the sidewall 24a of the opening 24, and the top surface 20a of the bottom electrode 20. After that, an anisotropic etching process may be performed to etch the spacer material layer until the top surface of the second dielectric layer 22 and the top surface 20a of the bottom electrode 20 are exposed, and a portion of the spacer material layer is remained on the sidewall 24a of the opening 24 to form the spacer 26. It should be understood that the spacer 26 may be formed along the sidewall 24a of the opening 24 and completely surrounds the opening 24. According to an embodiment of the present invention, the spacer 26 may include aluminum oxide ($Al_2O_3$) or silicon oxide ($SiO_2$), but is not limited thereto. It is noteworthy that, an inner sidewall 26a of the spacer 26 is exposed from the opening 24 and may include a curved cross-sectional profile due to the anisotropic etching process. An outer sidewall 26b of the spacer 26 contacts the second dielectric layer 22 and may include a cross-sectional profile conformal to the sidewall 24a of the opening 24. For example, the outer sidewall 26b of the spacer 26 may include a straight cross-sectional profile.

Figure 5:
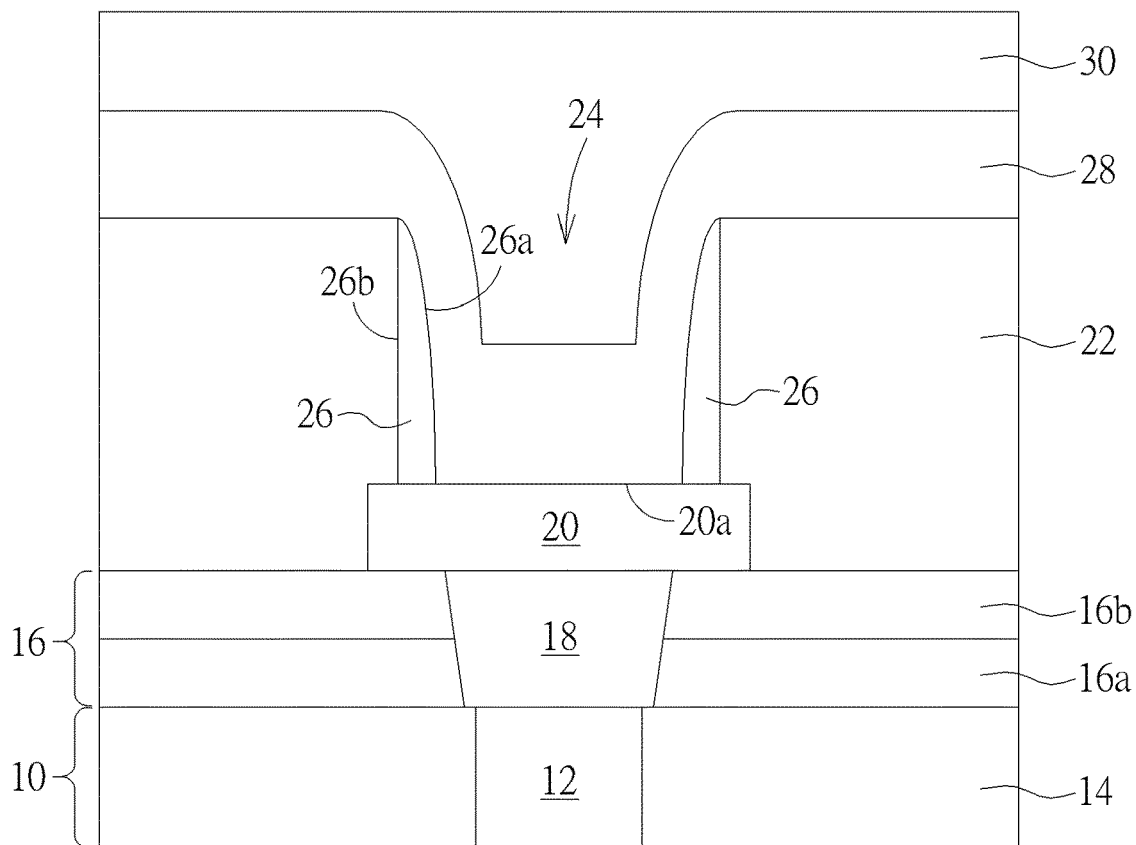

Please refer to FIG. 5. After forming the spacer 26, a variable-resistance material layer 28 is formed on the second dielectric layer 22. The variable-resistance material layer 28 partially fills the opening 24 and covers along the outer sidewall 26a of the spacer 26 and the top surface 20a of the bottom electrode 20. Subsequently, a top electrode material layer 30 is formed on the variable-resistance material layer 28 and completely fills the opening 24. The top electrode material layer 30 may include transition metal oxides (TMO), such as nickel oxide (NiO), titanium dioxide (TiO), zinc oxide (ZnO), zirconium oxide (ZrO), hafnium oxide (HfO), tantalum oxide (TaO), but is not limited thereto. The material of the top electrode material layer 30 may be selected from the metals for the bottom electrode 20, such as titanium nitride (TiN).

Figure 6:
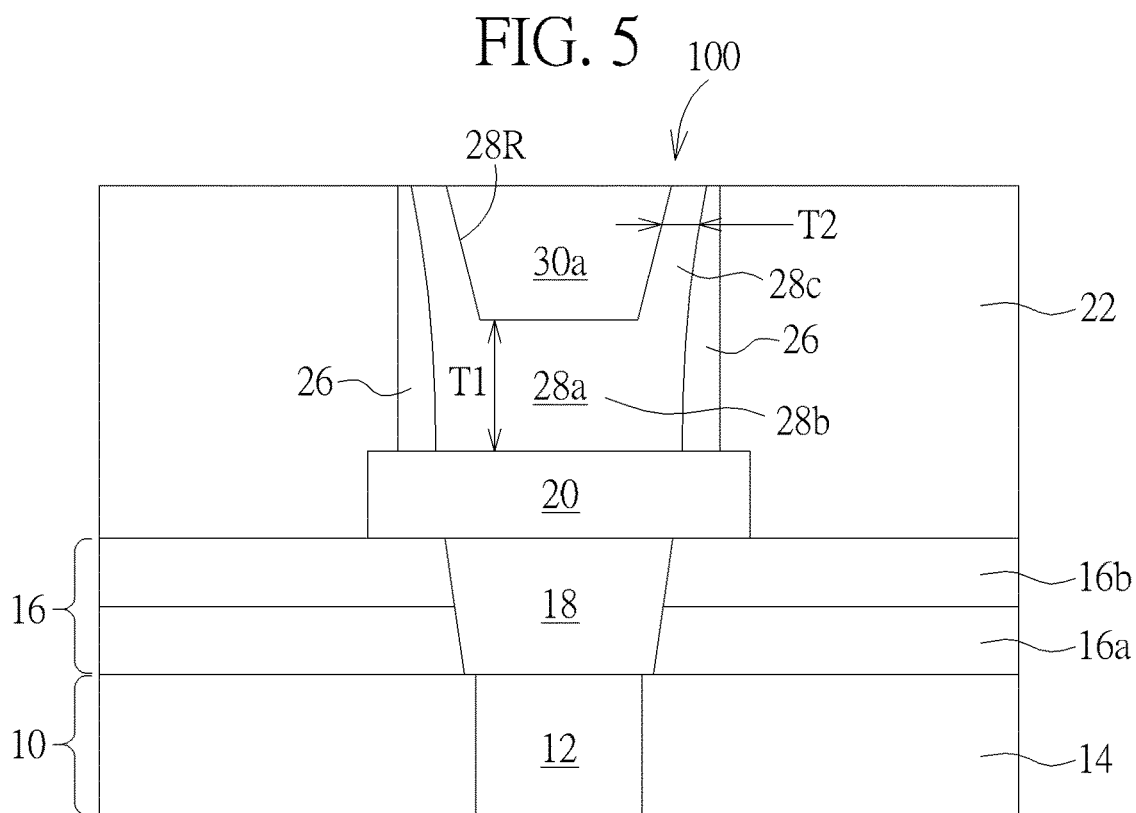

Please refer to FIG. 6. Subsequently, a planarization process such as a chemical mechanical polishing (CMP) process may be performed to remove the top electrode material layer 30 and the variable-resistance material layer 28 outside the opening 24 until the top surface of the second dielectric layer 22 is exposed. The top electrode material layer 30 and the variable-resistance material layer 28 remaining in the opening 24 become the top electrode 30a and the variable-resistance layer 28a, respectively. According to an embodiment of the present invention, after the planarization process, a top surface of the spacer 26 between the top electrode 30a and the second dielectric layer 22 may be exposed and flush with the top surface of the top electrode 30a, the top surface of the variable-resistance layer 28a, and the top surface of the second dielectric layer 22 along the horizontal direction.

Please continue to refer to FIG. 6. The memory cell 100 of the resistive random access memory according to an embodiment of the present invention includes a bottom electrode 20, a variable-resistance layer 28a disposed on the bottom electrode 20 and having a U-shaped cross-sectional profile, a top electrode 30a disposed on the variable-resistance layer 28a and completely filling the recess 28R in the variable-resistance layer 28a, and a spacer 26 disposed on the bottom electrode 20 and aside the variable-resistance layer 28a. To be more detailed, the variable-resistance layer 28a may include a horizontal portion 28b and a vertical portion 28c located on the horizontal portion 28b. The horizontal portion 28b is substantially between the top electrode 30b and the bottom electrode 20 along the vertical direction, while the vertical portion 28c is substantially between the top electrode 30b and the spacer 26 along the horizontal direction. It should be noted that the process parameters for forming the variable-resistance material layer 28 (see FIG. 5) may be adjusted to make the thickness T1 of the horizontal portion 28b of the variable-resistive layer 28a along the vertical direction larger than the thickness T2 of the vertical portion 28c along the horizontal direction. In this way, when the thickness T1 of the horizontal portion 28b reaches the required specification, the thickness T2 of the vertical portion 28c may be smaller to provide a recess 28R with a larger width, so that the top electrode 30a in the recess 28R may be formed with a larger width, which may provide a larger process window for the conductive via 34 (see FIG. 7) to land on the top electrode 30a and electrically connect to the top electrode 30a. According to an embodiment of the present invention, the thickness T2 of the vertical portion 28c may be approximately between ¼ and ¹⁄₁₀ of the thickness T1 of the horizontal portion 28b.

Figure 7:
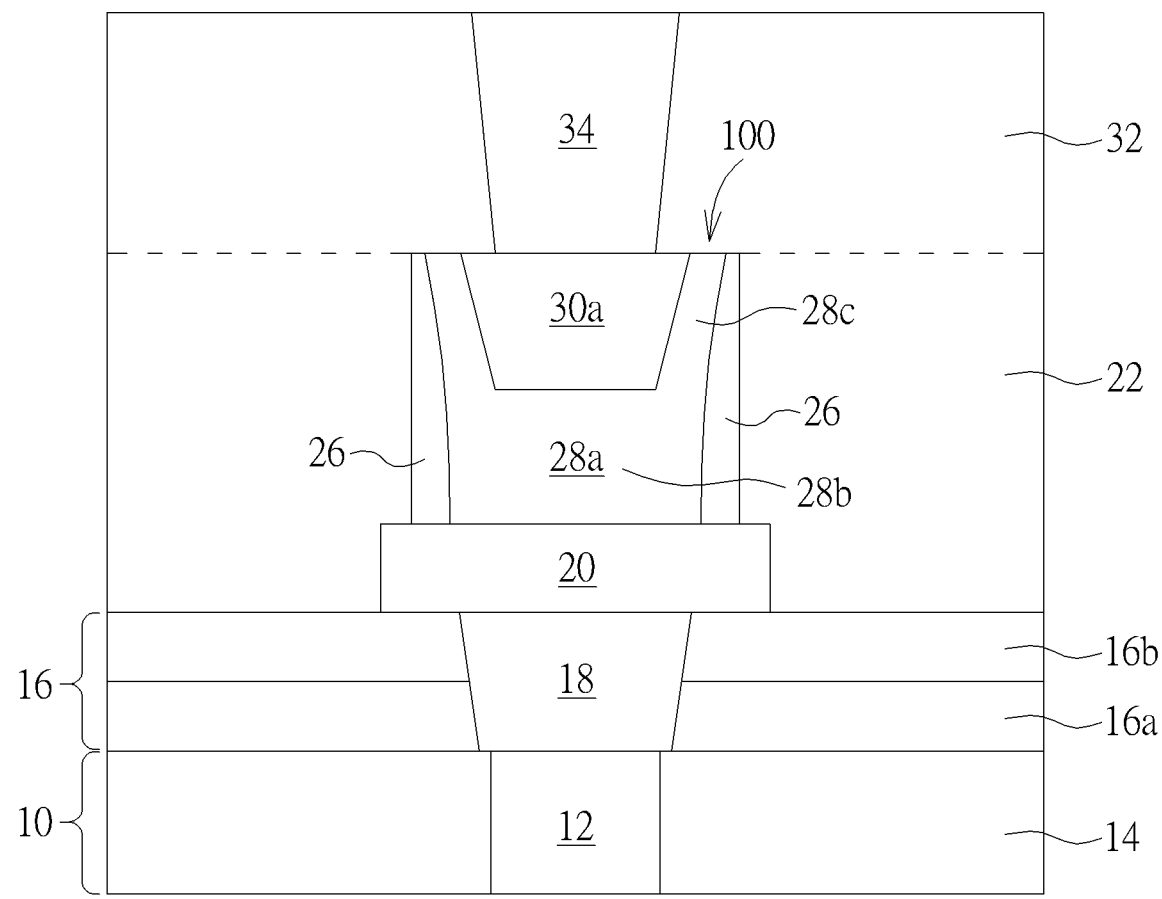

Please refer to FIG. 7. Following, a third dielectric layer 32 is formed on the second dielectric layer 22. A conductive via 34 is formed in the third dielectric layer 32 directly above the top electrode 30a and electrically connected to the top electrode 30a. The material of the third dielectric layer 32 may be selected from the dielectric materials for the dielectric layer 14 and the pad layer 16b previously illustrated, and will not be repeated here for the sake of simplicity. According to an embodiment of the present invention, the third dielectric layer 32 and the second dielectric layer 22 may include a same material, such as a low-k dielectric material. The third dielectric layer 32 is in direct contact with the top surface of the top electrode 30a, the top surface of the vertical portion 28c of the variable-resistance layer 28a, the top surface of the spacer 26, and the top surface of the second dielectric layer 22. The material of the conductive via 34 may be selected from the metals for the conductive structure 12, such as copper (Cu). According to an embodiment of the present invention, a barrier layer (not shown) may be disposed between the conductive via 34 and the third dielectric layer 32 and the top electrode 30a. The barrier layer may include a single layer or multiple layers formed by, for example, titanium, titanium nitride, tantalum, and/or tantalum nitride.

Figure 8:
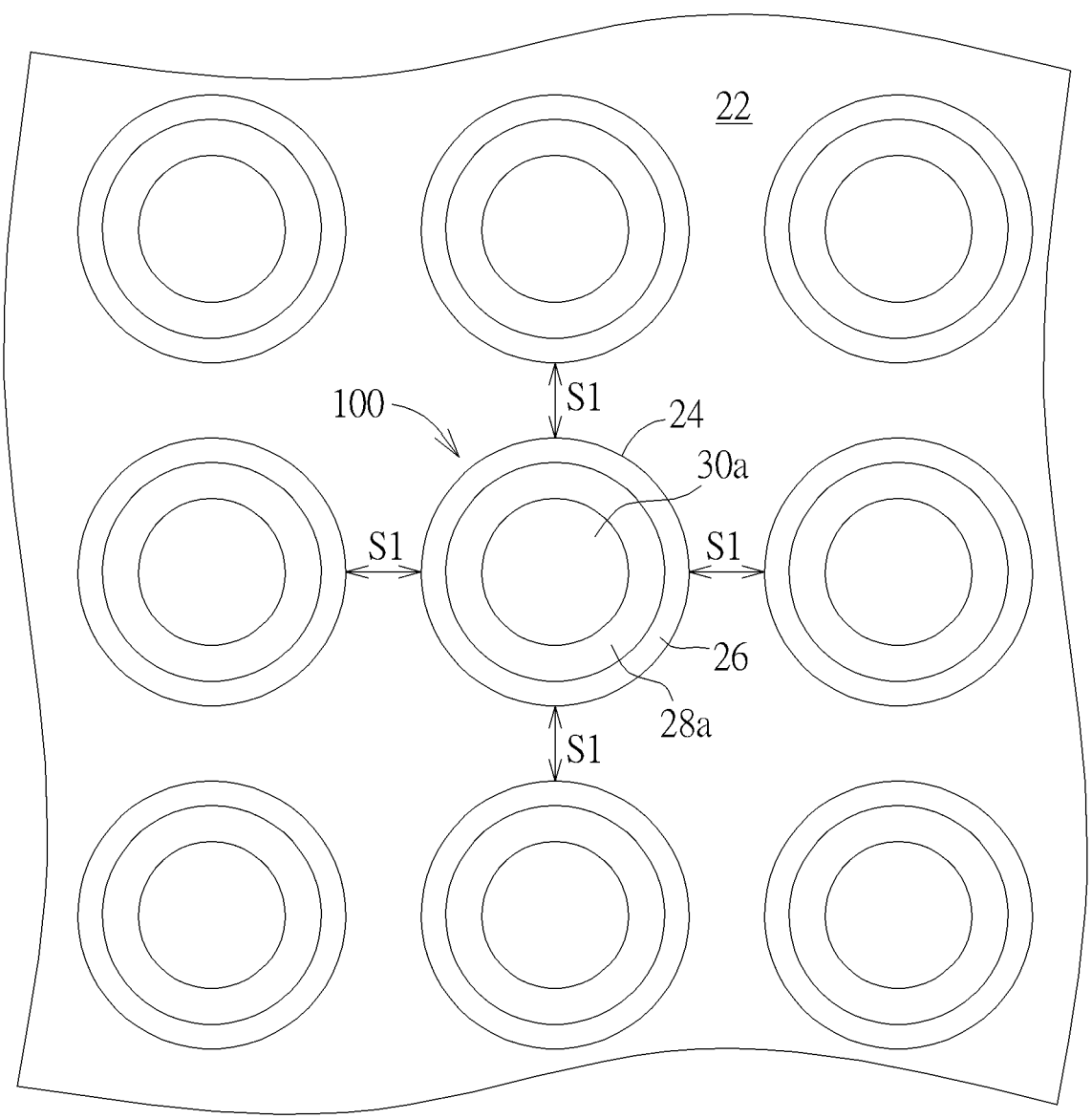
FIG. 8, FIG. 9 and FIG. 10 are schematic top views of the resistive random access memories at the step shown in FIG. 6 according to some embodiments of the present invention.
Figure 9:
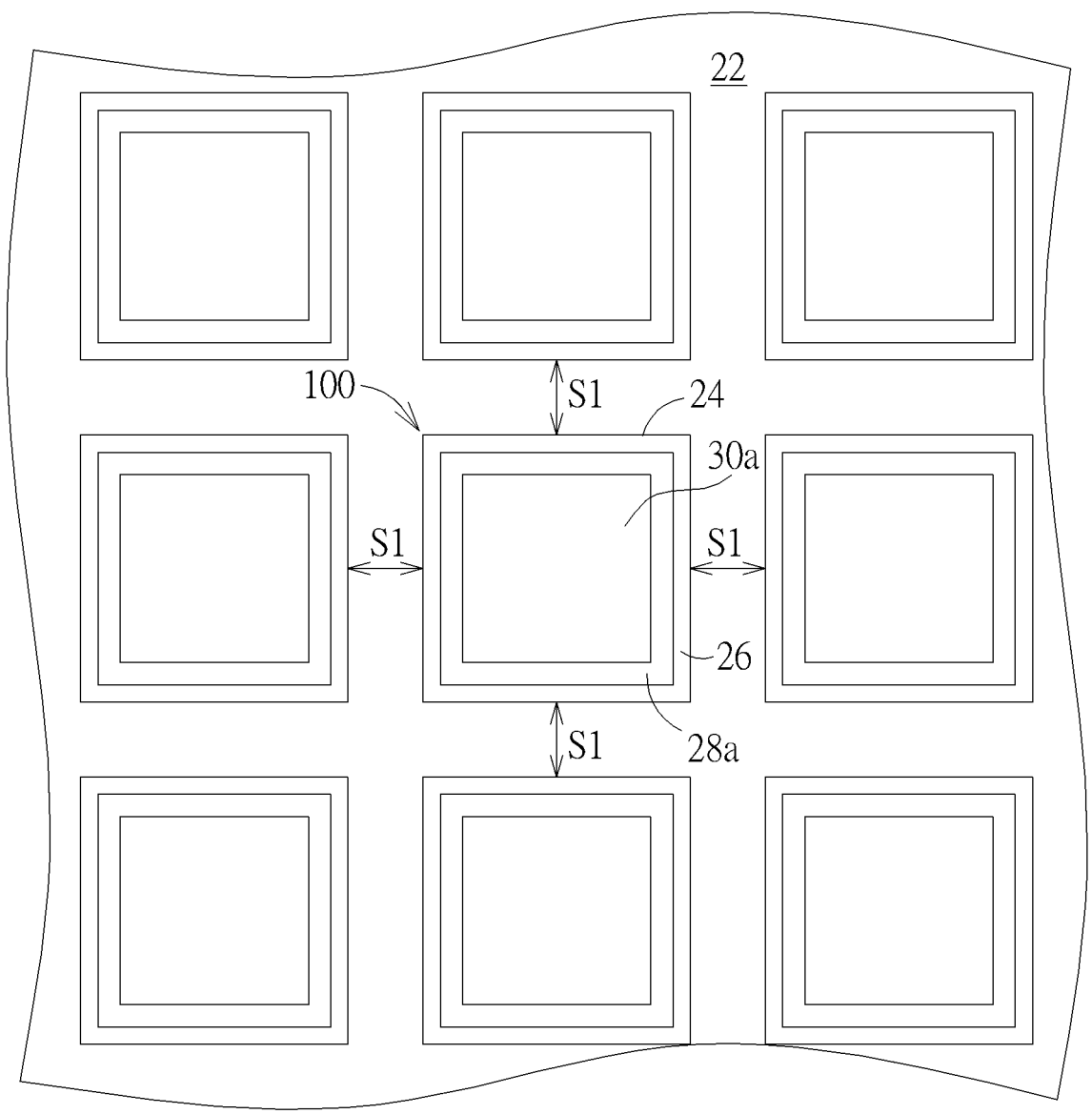
Figure 10:
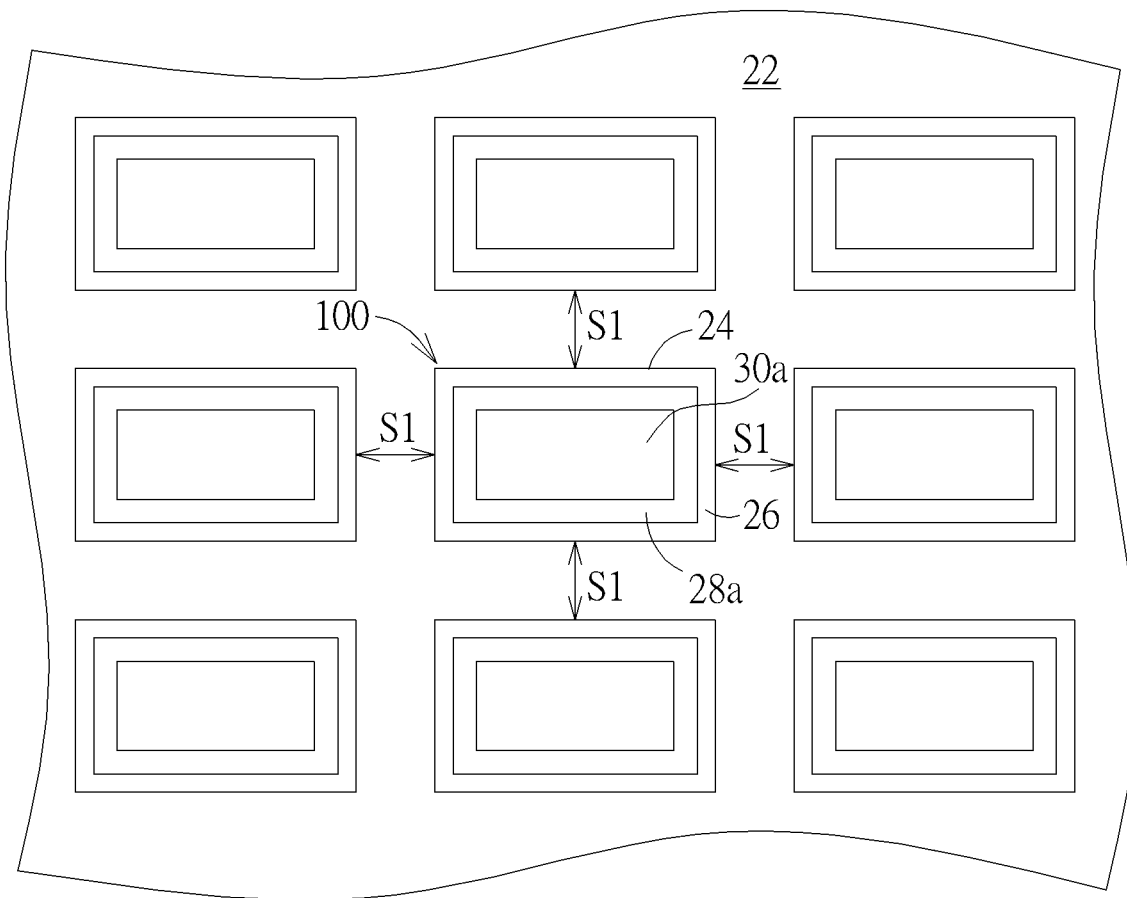

FIG. 8, FIG. 9 and FIG. 10 are schematic top views of the resistive random access memories at the step shown in FIG. 6 according to some embodiments of the present invention. As shown in the top view, the resistive random access memory includes a plurality of memory cells 100 that are arranged into an array and are spaced apart from each other by a distance S1. The shape of the top electrode 30a of the memory cell 100 is substantially determined by the shape of the opening 24. For example, the top electrode 30a may have a circular shape (FIG. 8), a square shape (FIG. 9), or a rectangular shape (FIG. 10), but is not limited thereto. The area of the top electrode 30a is smaller than the area of the opening 24 because of the spacer 26 formed in the opening 24. The top electrode 30a is completely surrounded by the variable-resistive layer 28 (specifically, by the vertical portion 28c of the variable-resistive layer 28), and the variable-resistive layer 28 is completely surrounded by the spacer 26.

One feature of the present invention is that the memory cells 100 of the resistive random access memory are formed by a process similar to a damascene process, which includes the steps of forming the second dielectric layer 22, forming the openings 24 corresponding to the memory cells to be formed in the second dielectric layer 22, forming the variable-resistance material layer 28 and the top electrode material layer 30 on the second dielectric layer 22 and filling the openings 24, and then removing the variable-resistance material layer 28 and the top electrode material layer 30 outside the openings 24 to obtain the variable-resistance layer 28a and the top electrode 30a of the memory cells 100. There is no need for the present invention to form a dielectric layer to fill the gaps between the memory cells 100, so that voids caused by insufficient gap fill capability of the dielectric layer may be prevented. In this way, the distance S1 between memory cells 100 may be further reduced without being limited by the gap fill capability of the dielectric layer, and a higher array density and memory capacity may be achieved.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A resistive random access memory, comprising:
   a first dielectric layer;
   a bottom electrode on the first dielectric layer;
   a variable-resistance layer on the bottom electrode and having a U-shaped cross-sectional profile;
   a top electrode on the variable-resistance layer and filling a recess in the variable-resistance layer;
   a second dielectric layer on the first dielectric layer and around the variable-resistance layer and the bottom electrode; and
   a spacer on the bottom electrode and inserting between the variable-resistance layer and the second dielectric layer.

2. The resistive random access memory according to claim 1, wherein the second dielectric layer is single-layered.

3. The resistive random access memory according to claim 1, wherein a top surface of the spacer is flush with a top surface of the second dielectric layer.

4. The resistive random access memory according to claim 1, wherein the spacer comprises an inner sidewall directly contacting the variable-resistance layer and an outer sidewall directly contacting the second dielectric layer.

5. The resistive random access memory according to claim 4, wherein the outer sidewall of the spacer and a sidewall of the bottom electrode have an offset to expose a top corner of the bottom electrode, and the top corner of the bottom electrode is covered by the second dielectric layer.

6. The resistive random access memory according to claim 1, wherein the top electrode comprises an upside down trapezoid cross-sectional profile.

7. The resistive random access memory according to claim 1, wherein the top electrode comprises a bottom surface, a top surface, and a sidewall between the bottom surface and the top surface, wherein a width of the bottom surface of the top electrode is smaller than a width of the top surface of the top electrode.

8. The resistive random access memory according to claim 7, wherein the width of the top surface of the top electrode is smaller than a width of the bottom electrode.

9. The resistive random access memory according to claim 7, wherein the top surface of the top electrode is flush with a top surface of the second dielectric layer.

10. The resistive random access memory according to claim 7, wherein a thickness of the variable-resistance layer between the bottom surface of the top electrode and the bottom electrode is larger than a thickness of the variable-resistance layer between the sidewall of the top electrode and the spacer.

* * * * *